United States Patent
Wilheim et al.

[11] Patent Number: 5,948,526
[45] Date of Patent: Sep. 7, 1999

[54] PROTECTED SHEET LAMINATE

[75] Inventors: Martin J. Wilheim, Larchmont; Allen H. Keough, Northborough, both of N.Y.

[73] Assignee: Metallized Products, Inc., Winchester, Mass.

[21] Appl. No.: 08/901,855

[22] Filed: Jul. 29, 1997

Related U.S. Application Data

[63] Continuation of application No. 08/548,492, Oct. 26, 1995, abandoned, which is a continuation-in-part of application No. 08/278,871, Jul. 8, 1994, abandoned.

[51] Int. Cl.[6] .............................. B23B 7/12; B23B 27/32
[52] U.S. Cl. .................. 428/352; 428/40.9; 428/345; 428/355 EN; 428/41.1; 428/423.7; 428/458; 428/482; 428/901; 428/523
[58] Field of Search .................... 428/40.9, 352, 428/345, 355 EN, 411.1, 423.7, 458, 482, 523, 901

[56] References Cited

U.S. PATENT DOCUMENTS

| | | | |
|---|---|---|---|
| 486,967 | 9/1892 | Robinson et al. | 156/233 |
| 3,932,250 | 1/1976 | Sato et al. | 156/213 |
| 4,088,544 | 5/1978 | Hutkin | 204/12 |
| 4,234,662 | 11/1980 | Pastor et al. | 428/500 |
| 4,623,594 | 11/1986 | Keough | 428/500 |
| 4,753,847 | 6/1988 | Wilheim | 428/901 |
| 4,820,745 | 4/1989 | Müller | 428/482 |
| 4,861,648 | 8/1989 | Kleinshmidt | 428/901 |
| 4,875,283 | 10/1989 | Johnston | 29/830 |
| 4,902,546 | 2/1990 | White | 428/40 |
| 4,933,233 | 6/1990 | Keough | 428/328 |
| 5,084,354 | 1/1992 | Krankkala et al. | 428/414 |
| 5,104,707 | 4/1992 | Watanabe | 428/40.9 |
| 5,110,668 | 5/1992 | Minnick | 428/215 |
| 5,120,590 | 6/1992 | Savage | 428/40.9 |
| 5,153,050 | 10/1992 | Johnston | 428/209 |
| 5,162,140 | 11/1992 | Taniguichi | 428/40 |
| 5,180,635 | 1/1993 | Plamthottam et al. | 428/345 |
| 5,223,553 | 6/1993 | Keough | 522/78 |

FOREIGN PATENT DOCUMENTS 26 26 039   12/1977   Germany .

Primary Examiner—Deborah Jones
Assistant Examiner—Cathy F. Lam
Attorney, Agent, or Firm—Rines and Rines

[57] ABSTRACT

A method for protecting a substrate sheet such as a conductive foil suitable for use in the manufacture of printed circuit boards involving applying a lamination mold-release layer to one side of a protective film, and applying a preferably electron beam curable adhesive pressure-sensitive coating to the other side of the film, curing the adhesive coating, and laminating the protective film to the foil or other substrate sheet, which, in turn, may be laminated to other substrates such as dielectric sheets, and in which the laminate product is a protected substrate sheet having a protective film laminated to one side of the sheet (or both), the film having a lamination mold-release layer on one side thereof and an electron beam cured pressure-sensitive adhesive coating on the other side thereof, said other side contacting but being releasably detachable from said substrate sheet, and further wherein the substrate sheet is a foil or similar surface, protection is thus provided during handling and storage as well as during lamination, and the protective film is peelably detachable from the foil.

11 Claims, 2 Drawing Sheets

PROTECTED SHEET LAMINATE

This application is a continuation of Ser. No. 08/548,492, filed on Oct. 26, 1995, which is a continuation-in-part of U.S. application Ser. No. 08/278,871, filed on Jul. 08, 1994, for Sheets With High Temperature Stable Protection Coating. Both applications are now abandoned.

The present invention relates to the field of thin film plastic release layers or coatings for the lamination of thin sheet materials, including thin copper sheets as of the type used in printed circuit boards and similar devices, enabling the sheet materials to be laminated at high temperatures and high pressures with other substrates without damage to the surface(s) of the thin sheets and with subsequent removal of the protective release layer(s) or coating(s), the invention being more particularly directed to the rendering of said protective layers or coatings adhesively attachable with high uniform surface attachment to, and releasable from, such sheets.

The present invention relates also to methods for protecting the surfaces of sheet metal foils or other sheet materials, all herein sometimes generically referred to as "sheets" or "foils" and to resulting novel protected sheets and laminated sheet products. One such product is useful as an intermediate product in the manufacture of printed circuit boards and the like. More particularly, the present invention especially relates to methods for protecting etchable conductive metal foil sheets or foil laminates (all hereinafter generically referred to as foils) using electron beam cured layers.

BACKGROUND OF THE INVENTION

Printed circuit boards having a high density of electrical interconnections and circuitry have been developed from multilayer printed circuit board laminates to meet the needs for miniaturized electronic components. The multilayer printed circuit board laminates are made from suitable reinforced resin materials and thin metal foils, particularly copper foils, which are processed together at high temperature and pressure, such laminates being used in the manufacture of printed circuit boards.

A printed circuit board is made from a laminate by etching away portions of the conductive foils from the laminate surface to leave distinct patterns of conductive lines and formed elements on the surface of the etched laminate. Additional laminates and/or laminate materials are then packaged together with the etched product to form a multilayer circuit board package. Additional processing, such as hole drilling and component attaching, completes the printed circuit board package.

While printed circuit boards are well known, printed circuit board technology continues to advance to provide higher density boards with smaller printed circuit lines. Miniaturization has advanced to the point, accordingly, that surface contamination in storage and handling has now become a significant problem in addition to the problem of protecting the surfaces from the effects of high-temperature and high-pressure lamination processes.

During the high-pressure and high-temperature lamination of the thin copper foils, thin plastic lamination mold release coating films or layers have been successfully temporarily interposed on the foil to minimize deleterious effects upon the foil surfaces during such lamination, as described, for example, in Martin J. Wilheim, U.S. Pat. No. 4,753,847 of common assignee of the present invention. Among such removable interposed layers have been sheets of polyvinyl fluoride and the like, such as those of the "Tedlar" type of the Dupont Company.

As for protection during handling and otherwise before lamination, a clean environment can help or at least minimize, contamination problems.

Another way to avoid or minimize such problems is to use protective films as suggested in U.S. Pat. No. 5,120,590, involving edge adhesive attachment of such films over the foil.

The present invention, however, provides a vastly improved way to protect the surfaces of sheets from contamination during each of handling, shipping, storage and lamination, remarkably to minimize contamination problems in the manufacture of circuit boards and the like; and, at the same time, to resist damaging effects of the before-described high-temperature (about 350° F.) and high pressure (about 500 to 1000 pounds/in$^2$) lamination to other substrates.

This invention takes advantage, moreover, of the high temperature stability of bonding materials achieved by processing appropriate reactive pressure-intact adhesives to such plastic films, preferably by electron-beam curing. Thus, the present invention provides a foil laminate having a foil-protecting, electron beam-cured film or layer serving as a covering or coating which can be readily removed from the foil surface following the appropriate processing, and with no visible residue left on the foil. Furthermore, the adhesive coating used in this invention on these protective films can be applied with a high degree of uniformity across the entire surface of the film and then uniformly applied upon the foil, not just at edges or select regions, and without concern of film placement over the foil surface, nor of the effects of elevated temperature and pressure on the chemical structure of said adhesive, or any physical or chemical effects upon the foil surface.

By combining on one surface (outer) of the thin protective film covering or layer, the type of pressure-and temperature-resistive mold release-coating treatment described in before-mentioned U.S. Pat. No. 4,753,847, for example, and, on the other surface inner or (bottom), a suitable releasably attached cured pressure-sensitive adhesive coating against the foil surface, an attached protective layer or coating for that foil is provided during each of handling, shipping and storage, and a mold-release layer for lamination protection, as well.

SUMMARY OF INVENTION

In summary, from one of its broader viewpoints, the invention embraces a protective film for releasable adhesion to a surface of a sheet and for providing surface protection during each of
  a) storage, shipping and handling of the sheet,
  b) the application of high pressure at high temperature to said surface to laminate the opposite surface of the sheet to a substrate,
  c) subsequent handling of the resulting laminate, and
  d) the ultimate release detachment of the film from said surface,
the film having an outer surface treated to resist high pressure laminating conditions at high temperature to serve as a lamination mold-release layer, and
an inner surface uniformly coated with a high-temperature, high-pressure-resistant pressure-sensitive adhesive layer for releasable attachment to said surface of the sheet, and inert to physical and chemical reaction with the sheet.

Preferred and best mode techniques and designs are hereinafter more fully described.

BRIEF DESCRIPTION OF THE DRAWING

The invention will now be described in connection with the accompanying drawings in which.

DESCRIPTION OF THE PREFERRED EMBODIMENTS

Figure 1:
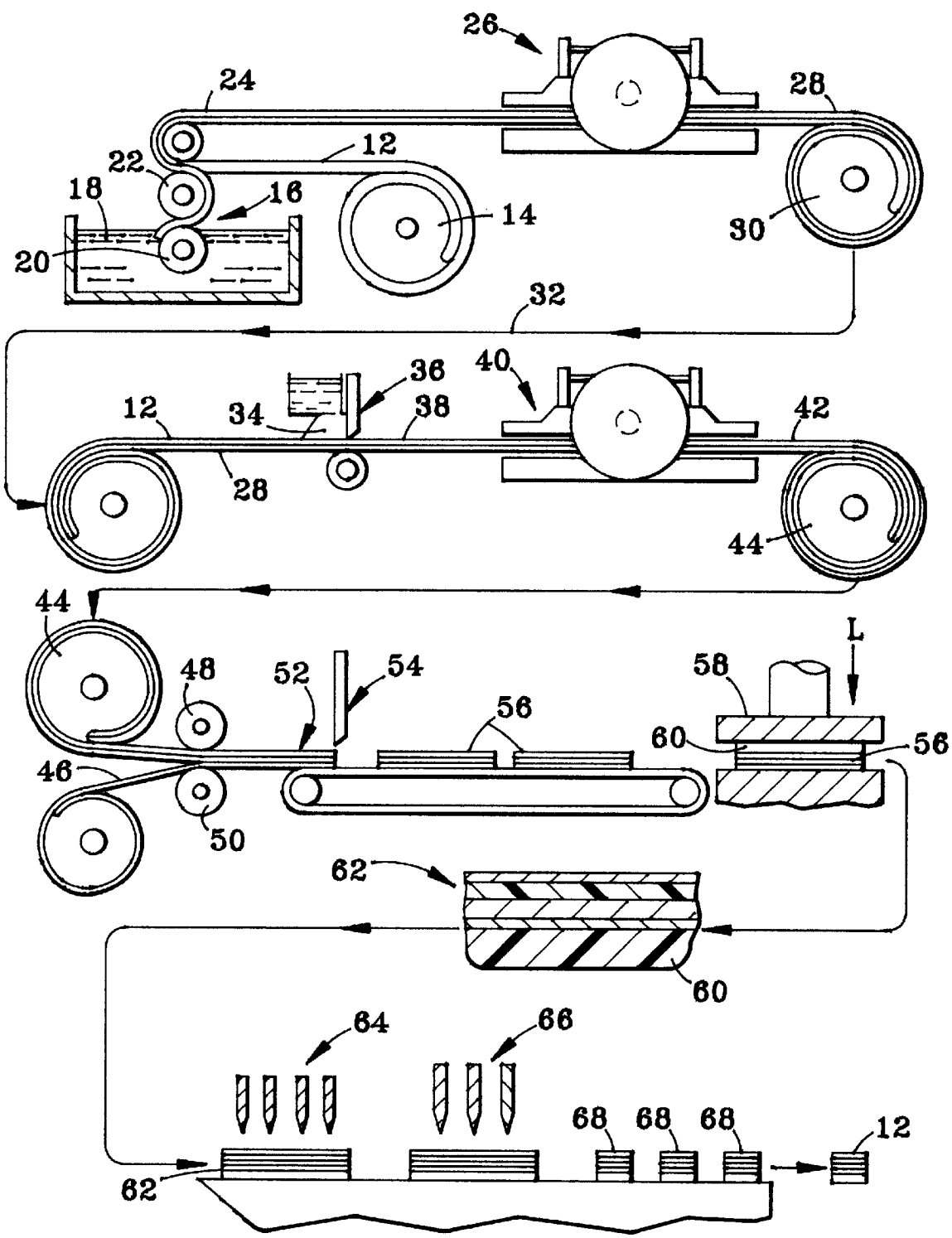
FIG. 1 is a somewhat schematic view illustrating a preferred embodiment of the process of the present invention.
Figure 2A:
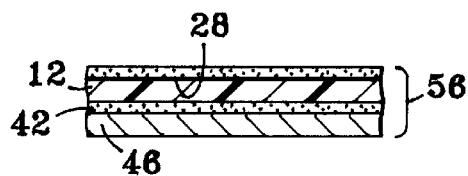
FIG. 2A is a fragmentary cross-section of a foil carrying a preferred form of protective film prepared by the process of FIG. 1 and applied on one surface of the foil and having a cured lamination-release coating on its outer surface and a cured pressure-sensitive adhesive on its inner surface against the foil.

In FIGS. 1 and 2A, a copper foil 46, as for printed circuit board use or the like, is shown provided along its upper surface with a protective layer 12, as of polyester film or other materials later described.

Figure 2B:
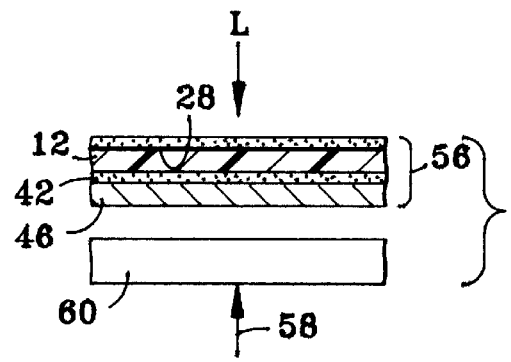
FIG. 2B is a similar view of the protected foil about to be laminated to a dielectric substrate.

As explained in previously mentioned U. S. Pat. No. 4,753,847, the electron-beam curing of suitable polymeric coatings on such a polyester film 12 inserted on top of a copper foil 46 to be laminated to, for example, a dielectric substrate 60, FIGS. 2B and 2C, as for such printed circuit board applications and the like, produces a lamination pressure mold-release coating 28 that protects and cushions the upper surface of the foil from the high lamination pressure and at the high temperatures involved in laminating the foil 46 as at L, FIGS. 1 and 2B, to the dielectric or other substrate 60. Suitable polymeric films of polyester, nylon or cellulose acetate and the like are described in this patent and are well useable with the present invention; such being treated for promotion of resin adhesion in laminates and having cured coatings of acrylated oligomer resins and the like.

In accordance with the present invention, a synergism is created for these and other additional functions, by actually adhering the film layer 12 to the copper foil 46 before lamination—the film 12 then being part of the foil and serving to protect the foil in storage, shipping and handling, even before lamination. The film, however, must itself be ultimately peelably releasable from the foil, as indicated more particularly in FIG. 2D, and must not itself contaminate, mar or alter the foil surface.

It has been discovered that such a result can be achieved through the uniform coating of the film, such as along the inner surface thereof, to be applied, for example, to the upper foil surface, with an appropriate high-temperature-high-pressure-resistant pressure-sensitive adhesive coating 42, preferably electron-beam curable and inert to any reaction, chemical or physical, with the surface of the foil 46. Suitable adhesives so applied include polyesters such as those having reactive unsaturated polymeric chain terminations, including the later-mentioned type Dynacoll A 2583 of Huls America, Inc., and/or condensation products of terephthalic acid and ethylene glycol chemically treated on both sides to promote adhesion, such as "Melinex 3'4" of ICI. Such adhesives are preferably coated on the polyester film inner surface with a uniform layer of the order of 0.5 mil coating thinness throughout—such adhesive coatings containing chemical terminations responsive to electron beam (and in some cases ultra-violet) radiation, serving as reactive oligomers or pre-polymers, and inert to reaction with the foil 46.

While, in prepared form, the lamination cushioning or pressure-release outer protective surface is provided by the cured polymer coating 28 on the film 12, other types of film covering, surfacing or treatment may be used to provide similar lamination pressure-release functions.

There are various techniques suitable for fabricating the novel protective films and composites of film-foil and film-foil laminate, etc., of the invention; but a preferred process will now be described with reference to FIG. 1 of the drawings.

FIG. 1 illustrates a preferred embodiment of a process of the present invention and shows a cross-section of a preferred product of the present invention. While the preferred embodiment of the present invention is described in terms of foil laminates used in making printed circuit boards, it will be appreciated by those skilled in the art that, broadly speaking, this invention is applicable to other products as well, including, as further illustrations, substrate sheets of glass, polycarbonate, acrylic, or other material.

In accordance with the process of FIG. 1, the before-described protective film 12, as of polyester sheet material, or the like, is unwound from roll 14 and is passed through offset gravure coating station 16. At offset gravure coating station 16, an electron beam-curable release coating material 18, such as the before-mentioned polymeric material, is taken up by roller 20, transferred to roller 22, and applied to one side of film 12 as a continuous coating 24, thereon. Film 12 with coating 24 is then passed through an electron beam curing apparatus 26 where an electron beam is applied to coating 24 which is thereby cured to form the before-mentioned cured coating 28, which serves as the previously described lamination-release layer or coating, FIGS. 2A and 2B. Film 12 with the now cured coating 28 thereon is wound onto roll 30.

Figure 2C:
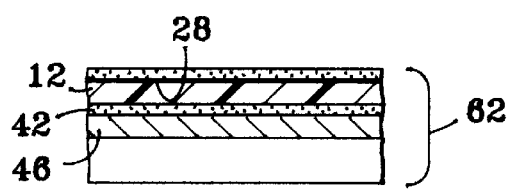
FIG. 2C is a similar view after lamination.

Roll 30 is then turned over as indicated at arrow 32 and the film 12 with its cured coating 28 thereon is unwound from roll 30 and an electron beam-curable adhesive coating material 34 is applied by a "knife over roll" applicator 36 to the previously uncoated side of film 12. Film 12 with adhesive coating 38 is then passed through electron beam curing apparatus 40 and an electron beam is applied to cure the adhesive material 34 on film 12 to form the before-described cured pressure-sensitive adhesive coating 42, FIGS. 1 and 2A. Film 12 is then rewound onto roll 44 and the adhesive side thereof is applied to a copper foil sheet laminate 46 between rolls 48 and 50. The now protected foil sheet laminate 52 is cut at station 54 to provide sheets 56, FIGS. 1 and 2A, which are heated and pressed at press 58 to bond or laminate at L with a dielectric sheet 60, and thus to form laminate 62, as shown in FIG. 2C. Finally, laminate 62 is allowed to cool. Laminate 62 is then further processed by suitable conventional processes such as drilling at 64 and cutting at 66 to provide a circuit board laminate 68 as is well known. Film 12 is then removed as shown at 70, FIGS. 1 and 2D.

Figure 4:
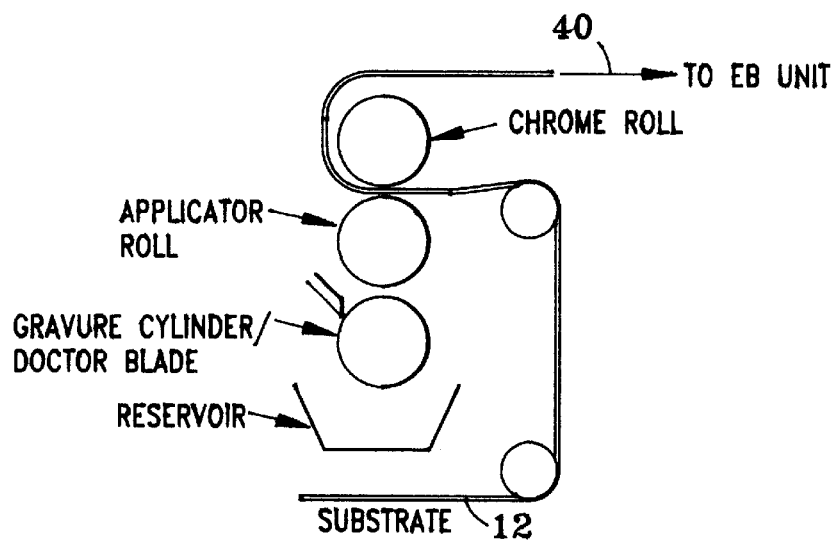
FIG. 4 is a view of a modified offset gravure manufacturing process step.

Instead of a "knife-over-roll" application technique, an offset gravure technique may be used as shown in FIG. 4, as may other well-known techniques be employed. In FIG. 4, the coating is applied by a gravure cylinder from a reservoir, so-labeled, under doctor blade control, to an applicator roll cooperating with a chrome roll or the like, as is well known.

EXAMPLE 1

Figure 2D:
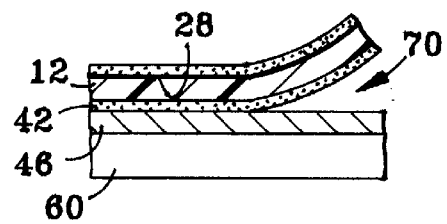
FIG. 2D is again a similar view showing the releasing of the protective film from the laminate.

A polyester film (92 ga—0.00092" thin—Melinex 314, ICI Resins) was installed in a coating machine equipped with an electron processor, manufactured by Energy Sciences, Inc. An electron beam curable release coating, such as that disclosed in said U.S. Pat. No. 4,753,847, was applied by an offset gravure application station to one side of the polyester film at a coating weight of approximately 3 lbs. per 3000 sq. ft. and cured by electron beam at a dose of 3 megarads. The film was turned over, and the beforementioned Dynacoll A 2583 polymeric coating, heated to suitable application viscosity (about 100° C.), was uniformly applied by a "knife over roll" applicator to the other side of the polyester film, and cured at a dose of 4 megarads at 165 KVs. The resulting pressure-adhesive side of the resulting roll of film was found to be easily releasable from the opposite side lamination release layer as in the roll and was applied to a copper foil sheet laminate, and pressed uniformly thereto at 350° F. at 500 psi for 90 minutes. Following the press cycle, the sample was allowed to cool; and subsequently the protective film was found to be easily removed by peeling from the copper sheet, as illustrated in FIG. 2D. There was no visible evidence of any surface contamination on the copper foil.

It has been found, furthermore, particularly where extremely thin metal foils are increasingly coming into use, that the protective film(s) of the invention, as above described, may also synergistically provide a useful measure of stiffening to the foil, desirable for its handling and support.

EXAMPLE 2

A roll of 48 ga polyester film chemically treated on one side (ICI type 813) was converted in a commercial vacuum metallizer for the deposition of aluminum onto the untreated side of the film to an aluminum thickness of about 3 ohms per square. The metallized polyester was then converted in accordance with Example 1 with Dynacoll A 2583 adhesive from a "knife-over-roll" device to the opposite side, i.e the treated side, of the polyester film, and cured by electron beam radiation at a dose of 4 megarads.

The cured adhesive released from the metallized surface which itself then served as a lamination release layer.

Figure 3:
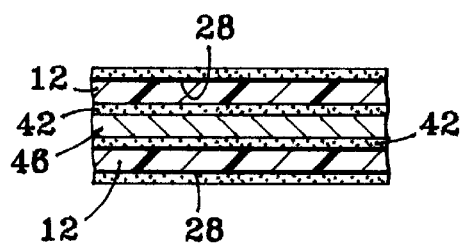
FIG. 3 is a cross-sectional view similar to FIG. 2A, but with a protective film applied to both surfaces of the foil.

While the invention has thus far been described with the protective film applied to one surface of the foil, a protective film may also be applied to the other side of the film as well, as shown in FIG. 3, such providing additional handling, shipping and storage protection; and, where appropriate, the optional selection of the side to which the lamination press is to be applied. In some instances, the mold-release layer may be separate from the film, though it is preferred to integrate the same into the film outer surface as above described.

Further modifications will also occur to those skilled in this art and such are considered to fall within the spirit and scope of the invention as defined in the appended claims.

What is claimed is:

1. A protected sheet laminate comprising
 (A) a substrate foil sheet;
 (B) a protective film laminated to said substrate sheet, said film having a release coating on one side and an electron beam cured adhesive coating on the other side, said other side being in adhesive contacting relationship with said substrate sheet, said protective film upon removal providing the substrate foil sheet with a substantially contaminate free surface, wherein the adhesive coating is a radiation-cured pressure-sensitive adhesive coating, and wherein the adhesive coating is an electron-beam-cured polyester pressure-sensitive adhesive.

2. A sheet as in claim 1 wherein said release coating is an electron beam cured polymeric release coating.

3. A sheet as in claim 1 wherein said substrate foil sheet is a copper foil laminate.

4. A sheet as claimed in claim 1 wherein the film is a thin polymeric sheet and said release coating is a radiation-cured polymeric release coating.

5. A sheet as claimed in claim 1 wherein an additional protective film is laminated along the surface of the substrate foil sheet opposite said contaminate-free surface.

6. A sheet as claimed in claim 1 wherein a dielectric substrate is laminated along the surface of the substrate foil sheet opposite said contaminate-free surface.

7. A protected-sheet laminate comprising
 (A) a substrate sheet, a surface of which is to be protected before use;
 (B) a protective film laminated on one side to said surface with an interposed adhesive layer having the property of permanently attaching to the film but releasably attaching to said surface of the substrate sheet;
 (C) and the protective film carrying on its other side a mold-release layer coated upon said other side; whereby peeling of the film from the said surface of the substrate sheet releases the attachment of said adhesive layer to said surface, providing the substrate sheet with a substantially contaminate-free surface, wherein the adhesive layer is a radiation-cured pressure-sensitive adhesive layer, and wherein the adhesive layer is an electron-beam-cured polyester pressure-sensitive adhesive.

8. A sheet as claimed in claim 7 wherein said mold release layer is an electron-beam cured polymeric release coating.

9. A sheet as claimed in claim 7 wherein the film is a thin polymeric sheet and said mold release layer is a radiation-cured polymeric coating.

10. A protected sheet laminate as claimed in claim 7 wherein the substrate sheet comprises a metal foil.

11. A protected-sheet laminate comprising
 (A) a substrate sheet, a surface of which is to be protected before use;
 (B) a protective film laminated on one side to said surface with an interposed adhesive layer having the property of permanently attaching to the film but releasably attaching to said surface of the substrate sheet;
 (C) and the protective film carrying on its other side a mold-release layer coated upon said other side; whereby peeling of the film from the said surface of the substrate sheet releases the attachment of said adhesive layer to said surface, providing the substrate sheet with a substantially contaminate-free surface, wherein the adhesive layer is a radiation-cured pressure-sensitive adhesive layer, and wherein the adhesive layer is selected from the group consisting of polyesters having reactive unsaturated polymeric chain terminations, and condensation products of teriphthalic acid and ethylene glycol.

* * * * *